(12) United States Patent
Kono et al.

(10) Patent No.: US 10,741,686 B2
(45) Date of Patent: Aug. 11, 2020

(54) METHOD FOR MANUFACTURING SEMICONDUCTOR DEVICE AND SEMICONDUCTOR DEVICE

(71) Applicant: Kabushiki Kaisha Toshiba, Minato-ku, Tokyo (JP)

(72) Inventors: Hiroshi Kono, Himeji Hyogo (JP); Tomohiro Nitta, Himeji Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/070,884

(22) Filed: Mar. 15, 2016

(65) Prior Publication Data
US 2017/0077290 A1 Mar. 16, 2017

(30) Foreign Application Priority Data
Sep. 14, 2015 (JP) .................................. 2015-180505

(51) Int. Cl.
| H01L 21/38 | (2006.01) |
| H01L 29/78 | (2006.01) |
| H01L 21/04 | (2006.01) |
| H01L 29/66 | (2006.01) |
| H01L 29/04 | (2006.01) |
| H01L 29/06 | (2006.01) |
| H01L 29/16 | (2006.01) |
| H01L 29/167 | (2006.01) |
| H01L 29/10 | (2006.01) |
| H01L 29/739 | (2006.01) |

(52) U.S. Cl.
CPC ........ *H01L 29/7813* (2013.01); *H01L 21/047* (2013.01); *H01L 29/045* (2013.01); *H01L 29/0615* (2013.01); *H01L 29/0634* (2013.01); *H01L 29/167* (2013.01); *H01L 29/1608* (2013.01); *H01L 29/66068* (2013.01); *H01L 29/7811* (2013.01); H01L 29/1095 (2013.01); H01L 29/7397 (2013.01)

(58) Field of Classification Search
CPC ............... H01L 29/7813; H01L 29/045; H01L 29/0634; H01L 29/167; H01L 21/047; H01L 29/7811; H01L 29/1095; H01L 29/1608; H01L 29/66068
See application file for complete search history.

(56) References Cited

U.S. PATENT DOCUMENTS

| 6,229,148 B1 * | 5/2001 | Prall | .................... H01J 37/3171 250/492.21 |
| 7,517,807 B1 * | 4/2009 | Tucker | ................ H01L 21/0332 438/637 |
| 8,125,023 B2 | 2/2012 | Ohta et al. | |

(Continued)

FOREIGN PATENT DOCUMENTS

| CN | 101866921 A | 10/2010 |
| JP | 10-256173 A | 9/1998 |

(Continued)

Primary Examiner — Steven H Loke
Assistant Examiner — Samuel Park
(74) Attorney, Agent, or Firm — White & Case LLP

(57) ABSTRACT

A method for manufacturing a semiconductor device according to an embodiment includes implanting impurity ions into a SiC layer in a direction of <10-11>±1 degrees, <10-1-1>±1 degrees, <10-12>±1 degrees, or <10-1-2>±1 degrees.

2 Claims, 13 Drawing Sheets

(56) References Cited

U.S. PATENT DOCUMENTS

| | | |
|---|---|---|
| 9,484,413 B2 | 11/2016 | Van Brunt et al. |
| 9,768,259 B2 | 9/2017 | Suvorov et al. |
| 2006/0065899 A1 | 3/2006 | Hatakeyama et al. |
| 2007/0228505 A1* | 10/2007 | Mazzola ............. H01L 29/8611 257/471 |
| 2008/0001159 A1 | 1/2008 | Ota et al. |
| 2008/0012026 A1* | 1/2008 | Tsuji .................... H01L 21/047 257/77 |
| 2008/0203400 A1* | 8/2008 | Fukuda ................ H01L 21/049 257/77 |
| 2011/0114916 A1* | 5/2011 | Yoshizumi ............ B82Y 20/00 257/13 |
| 2013/0299849 A1* | 11/2013 | Tega ................... H01L 29/0607 257/77 |
| 2015/0028350 A1* | 1/2015 | Suvorov ............. H01L 29/1608 257/77 |
| 2015/0028351 A1 | 1/2015 | Van Brunt et al. |
| 2015/0097226 A1* | 4/2015 | Lichtenwalner .... H01L 29/4925 257/329 |
| 2015/0129894 A1* | 5/2015 | Kinoshita ........... H01L 29/6606 257/77 |
| 2015/0214353 A1 | 7/2015 | Yamada et al. |
| 2017/0084700 A1 | 3/2017 | Van Brunt et al. |
| 2018/0069083 A1 | 3/2018 | Suvorov et al. |

FOREIGN PATENT DOCUMENTS

| | | |
|---|---|---|
| JP | 2004-039744 A | 2/2004 |
| JP | 2004-063479 A | 2/2004 |
| JP | 2004-095640 A | 3/2004 |
| JP | 2006-100593 A | 4/2006 |
| JP | 2008-16461 A | 1/2008 |
| JP | 2008-227239 A | 9/2008 |
| JP | 2010-267762 A | 11/2010 |
| JP | 2014-086483 A | 5/2014 |
| JP | 2015-126192 A | 7/2015 |
| JP | 2016-530712 A | 9/2016 |
| WO | 2015-013620 A1 | 1/2015 |
| WO | 2016-084141 A1 | 6/2016 |

\* cited by examiner

METHOD FOR MANUFACTURING SEMICONDUCTOR DEVICE AND SEMICONDUCTOR DEVICE

CROSS-REFERENCE TO RELATED APPLICATION

This application is based upon and claims the benefit of priority from Japanese Patent Application No. 2015-180505, filed on Sep. 14, 2015, the entire contents of which are incorporated herein by reference.

FIELD

Embodiments described herein relate generally to a method for manufacturing a semiconductor device and a semiconductor device.

BACKGROUND

Silicon carbide (SiC) is expected to be used as a material for a next-generation semiconductor device. SiC has the following excellent physical properties: a band gap is three times wider than that of silicon (Si); breakdown field strength is about ten times more than that of Si; and thermal conductivity is about three times more than that of Si. The use of these characteristics makes it possible to achieve a semiconductor device which has low power consumption and can operate at a high temperature.

An impurity diffusion coefficient in SiC is less than that of Si. Therefore, for example, even if a heat treatment is performed after impurities are introduced into SiC by ion implantation, it is difficult to drastically change an impurity profile by diffusion. For this reason, it is necessary to perform ion implantation with high accelerating voltage in order to form a deep pn junction in SiC using ion implantation.

However, there is a limitation to the accelerating voltage due to capability of an ion implantation apparatus. In addition, it costs a lot to perform ion implantation with high accelerating voltage.

DETAILED DESCRIPTION

Figure 1:
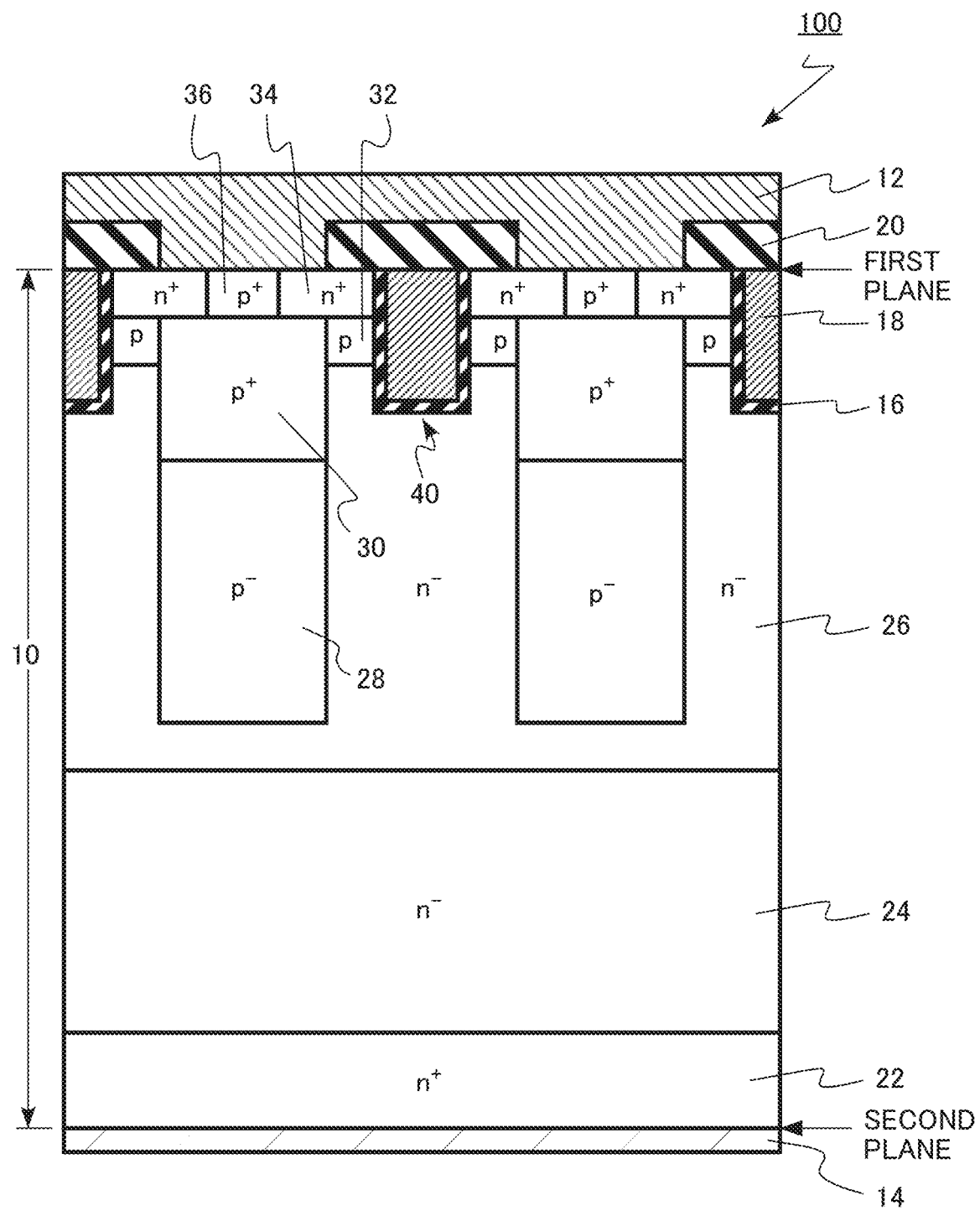
FIG. 1 is a cross-sectional view schematically illustrating a semiconductor device according to a first embodiment.

A method for manufacturing a semiconductor device according to an embodiment includes implanting impurity ions into a SiC layer in a direction of <10-11>±1 degrees, <10-1-1>±1 degrees, <10-12>±1 degrees, or <10-1-2>±1 degrees.

Hereinafter, embodiments of the invention will be described with reference to the drawings. In the following description, for example, the same or similar members are denoted by the same reference numerals and the description thereof will not be repeated.

In the following description, $n^+$, n, $n^-$, $p^+$, p, and $p^-$ indicate the relative impurity concentrations of each conductivity type. That is, $n^+$ indicates an n-type impurity concentration that is relatively higher than that of n and $n^-$ indicates an n-type impurity concentration that is relatively lower than that of n. In addition, $p^+$ indicates a p-type impurity concentration that is relatively higher than that of p and $p^-$ indicates a p-type impurity concentration that is relatively lower than that of p. In some cases, an $n^+$ type and an $n^-$ type are simply referred to as an n type and a $p^+$ type and a $p^-$ type are simply referred to as a p type.

First Embodiment

In a semiconductor device manufacturing method according to this embodiment, impurity ions are implanted into a SiC layer in a direction of <10-11>±1 degrees, <10-1-1>±1 degrees, <10-12>±1 degrees, or <10-1-2>±1 degrees. In addition, aluminum ions are implanted into the SiC layer in a direction of <0001>±1 degrees or <000-1>±1 degrees.

A semiconductor device according to this embodiment includes: an device region which is a portion of a SiC layer having a first plane and a second plane; a termination region which is a portion of the SiC layer and surrounds the element region; a first electrode; a second electrode which faces the first electrode, with the SiC layer interposed therebetween; a first SiC region of a first conductivity type which is provided in the SiC layer; a second SiC region of a second conductivity type which is provided between the first SiC region and the first plane in the termination region, is electrically connected to the first electrode, and surrounds the device region; and a third SiC region of the second conductivity type which is provided between the second SiC region and the second plane and has a second-plane-side corner portion that faces the second SiC region, with a portion of the first SiC region interposed therebetween.

FIG. 1 is a cross-sectional view schematically illustrating the semiconductor device according to this embodiment. The semiconductor device according to this embodiment is a vertical trench-gate MOSFET 100 using silicon carbide (SiC). The MOSFET 100 has a super-junction structure (hereinafter, also referred to as an "SJ structure").

In the SJ structure, a p-type (or n-type) semiconductor region is buried in an n-type (or p-type) semiconductor region and n-type regions and p-type regions are alternately arranged. The n-type region and the p-type region are depleted to obtain a high breakdown voltage. At the same time, a current flows to a high impurity concentration region to achieve low on-resistance. Hereinafter, an example in which a first conductivity type is an n type and a second conductivity type is a p type will be described.

A SiC layer of the MOSFET 100 includes an device region and a termination region which surrounds the device region. The device region functions as a region in which a current mainly flows when the MOSFET 100 is turned on. The termination region has a termination structure which reduces the strength of the electric field applied to the end of the device region when the MOSFET 100 is turned off and improves the element breakdown voltage of the MOSFET 100. FIG. 1 is a cross-sectional view including the device region of the MOSFET 100.

The MOSFET 100 includes a SiC layer 10, a source electrode (first electrode) 12, a drain electrode (second electrode) 14, a gate insulating film 16, a gate electrode 18, an interlayer insulating film 20, and a trench 40. The SiC layer includes an n$^+$-type drain region 22, an n$^-$-type first drift region 24, an n$^-$-type second drift region (first SiC region) 26, a p$^-$-type low-concentration pillar region (fourth SiC region) 28, a p$^-$-type high-concentration pillar region 30, a p-type body region 32, an n$^+$-type source region 34, a p$^+$-type contract region 36, a p$^-$-type RESURF region (second SiC region) 42, and an end region (third SiC region) 44. The low-concentration pillar region 28 corresponds to the p-type region of the SJ structure and the second drift region 26 corresponds to the n-type region of the SJ structure.

The SiC layer 10 is a single crystal SiC layer. The SiC layer 10 is, for example, a 4H—SiC layer.

The SiC layer 10 has a first plane and a second plane. Hereinafter, the first plane is also referred to as a front surface and the second plane is also referred to as a rear surface. Hereinafter, the term "depth" means a depth from the first plane.

For example, the first plane is inclined at an angle that is equal to or greater than 0° and equal to or less than 8° with respect to the (0001) face. For example, the second plane is inclined at an angle that is equal to or greater than 0° and equal to or less than 8° with respect to the (000-1) face. The (0001) face is referred to as a silicon face. The (000-1) face is referred to as a carbon face.

The n$^+$-type drain region 22 is provided on the rear surface of the SiC layer 10. The drain region 22 includes, for example, nitrogen (N) as n-type impurities. The n-type impurity concentration of the drain region 22 is, for example, equal to or greater than $1\times10^{18}$ cm$^{-3}$ and equal to or less than $1\times10^{21}$ cm$^{-3}$.

The n$^-$-type first drift region 24 is provided on the drain region 22. The first drift region 24 is provided between the second drift region 26 and the rear surface of the SiC layer 10.

The first drift region 24 includes, for example, nitrogen (N) as n-type impurities. The n-type impurity concentration of the first drift region 24 is lower than the n-type impurity concentration of the second drift region 26. The n-type impurity concentration of the first drift region 24 is, for example, equal to or greater than $4\times10^{14}$ cm$^{-3}$ and equal to or less than $6\times10^{16}$ cm$^{-3}$. The thickness of the first drift region 24 is, for example, equal to or greater than 0.1 μm and equal to or less than 150 μm.

The n$^-$-type second drift region 26 is provided on the first drift region 24.

The second drift region 26 includes, for example, nitrogen (N) as n-type impurities. The n-type impurity concentration of the second drift region 26 is, for example, equal to or greater than $5\times10^{16}$ cm$^{-3}$ and equal to or less than $5\times10^{17}$ cm$^{-3}$. The thickness of the second drift region 26 is, for example, equal to or greater than 3 μm and equal to or less than 10 μm.

The p$^-$-type low-concentration pillar region 28 is provided in the second drift region 26. The low-concentration pillar region 28 includes, for example, aluminum (Al) as p-type impurities. The p-type impurity concentration of the low-concentration pillar region 28 is, for example, equal to or greater than $1\times10^{16}$ cm$^{-3}$ and equal to or less than $1\times10^{19}$ cm$^{-3}$.

The depth of the low-concentration pillar region 28 is, for example, equal to or greater than 2 μm and equal to or less than 10 μm. The width of the low-concentration pillar region 28 is, for example, equal to or greater than 0.5 μm and equal to or less than 2.5 μm.

The p$^+$-type high-concentration pillar region 30 is provided between the low-concentration pillar region 28 and the front surface of the SiC layer 10. The high-concentration pillar region 30 is provided so as to come into contact with the low-concentration pillar region 28.

The high-concentration pillar region 30 includes, for example, aluminum (Al) as p-type impurities. The p-type impurity concentration of the high-concentration pillar region is higher than the p-type impurity concentration of the low-concentration pillar region 28. The p-type impurity concentration of the high-concentration pillar region 30 is, for example, equal to or greater than $1\times10^{18}$ cm$^{-3}$ and equal to or less than $1\times10^{20}$ cm$^{-3}$.

The depth of the high-concentration pillar region 30 is greater than the depth of the trench 40. The depth of the high-concentration pillar region 30 is, for example, equal to or greater than 1 μm and equal to or less than 3 μm. The width of the high-concentration pillar region 30 is, for example, equal to or greater than 0.5 μm and equal to or less than 2.5 μm.

The p-type body region 32 is provided between the second drift region 26 and the front surface of the SiC layer 10. The body region 32 is provided between the high-concentration pillar region 30 and the gate electrode 18. The body region 32 functions as a channel region of the MOSFET 100.

The body region 32 includes, for example, aluminum (Al) as p-type impurities. The p-type impurity concentration of the body region 32 is lower than the p-type impurity concentration of the high-concentration pillar region 30. The p-type impurity concentration of the body region 32 is, for example, equal to or greater than $1\times10^{17}$ cm$^{-3}$ and equal to or less than $5\times10^{18}$ cm$^{-3}$. The depth of the body region 32 is, for example, equal to or greater than 0.3 μm and equal to or less than 0.8 μm.

The n$^+$-type source region 34 is provided between the body region 32 and the front surface of the SiC layer 10. At least a portion of the source region 34 is provided in the front surface of the SiC layer 10.

The source region 34 includes, for example, nitrogen (N) as n-type impurities. The n-type impurity concentration of the source region 34 is, for example, equal to or greater than $1\times10^{19}$ cm$^{-3}$ and equal to or less than $1\times10^{21}$ cm$^{-3}$. The depth of the source region 34 is less than the depth of the body region 32 and is, for example, equal to or greater than 0.1 μm and equal to or less than 0.4 μm.

The p+-type contract region 36 is provided between the high-concentration pillar region 30 and the front surface of the SiC layer 10. For example, the contract region 36 is provided so as to come into contact with the high-concentration pillar region 30. The contract region 36 is provided so as to come into contact with the source region 34.

The contract region 36 includes, for example, aluminum (Al) as p-type impurities. The p-type impurity concentration of the contract region 36 is, for example, equal to or greater than $1\times10^{19}$ cm$^{-3}$ and equal to or less than $1\times10^{21}$ cm$^{-3}$.

The depth of the contract region 36 is less than the depth of the body region 32 and is, for example, equal to or greater than 0.1 μm and equal to or less than 0.4 μm.

The gate electrode 18 is provided in the trench 40 which is formed in the SiC layer 10. The gate electrode 18 is provided on the gate insulating film 16.

The gate electrode 18 is a conductive layer. The gate electrode 18 is, for example, a polysilicon film including p-type impurities or n-type impurities.

The gate insulating film 16 is provided in the trench 40. The depth of the trench 40 is less than the depth of the high-concentration pillar region.

The gate insulating film 16 is, for example, a silicon oxide film. For example, a high-k insulating film (high-permittivity insulating film) can be applied as the gate insulating film 16.

The interlayer insulating film 20 is provided on the gate electrode 18. The interlayer insulating film 20 is, for example, a silicon oxide film.

The source electrode 12 is provided on the front surface of the SiC layer 10. The source electrode 12 is electrically connected to the source region 34, the contract region 36, and the high-concentration pillar region 30. The source electrode 12 comes into contact with the source region 34 and the contract region 36.

The source electrode 12 includes metal. Metal forming the source electrode 12 has, for example, a laminated structure of titanium (Ti) and aluminum (Al). The source electrode 12 may include metal silicide or metal carbide which comes into contact with the SiC layer 10.

The drain electrode 14 is provided on the rear surface of the SiC layer 10. The drain electrode 14 is electrically connected to the drain region 22.

The drain electrode 14 is made of, for example, metal or a metal semiconductor compound. The drain electrode 14 has a laminated structure of, for example, titanium (Ti), nickel (Ni), silver (Ag), and gold (Au). The drain electrode 14 may include metal silicide or metal carbide which comes into contact with the SiC layer 10.

Figure 2:
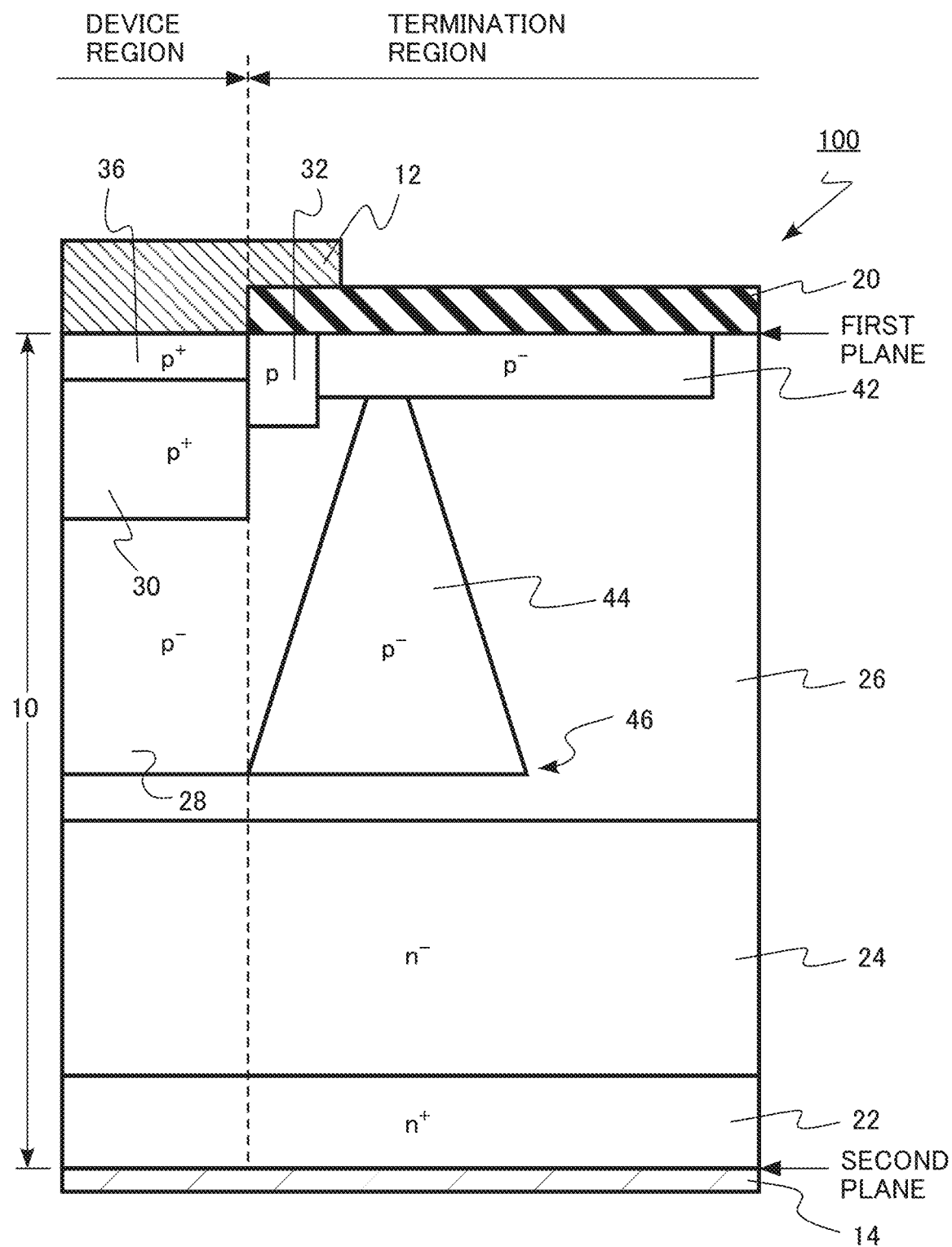
FIG. 2 is a cross-sectional view schematically illustrating the semiconductor device according to the first embodiment.

FIG. 2 is a cross-sectional view schematically illustrating the semiconductor device according to this embodiment. FIG. 2 is a cross-sectional view including the termination region of the MOSFET 100. FIG. 2 is a cross-sectional view illustrating the end of the low-concentration pillar region 28 in a direction perpendicular to the cross-sectional view of FIG. 1.

The termination region of the MOSFET 100 includes a p⁻-type RESURF region 42 and a p⁻-type end region 44. The p⁻-type RESURF region 42 and the p⁻-type end region 44 form a termination structure of the MOSFET 100.

The p⁻-type RESURF region 42 is provided between the n⁻-type second drift region 26 and the front surface of the SiC layer 10. The RESURF region 42 is provided so as to come into contact with the front surface of the SiC layer 10. The RESURF region 42 comes into contact with the body region 32. The interlayer insulating film 20 is provided on the RESURF region 42.

The RESURF region 42 is provided in an annular shape which surrounds the device region of the MOSFET 100. The RESURF region 42 is provided so as to come into contact with the p-type body region 32. The RESURF region 42 has a function which reduces a high electric field applied to the termination portion of the device region when the MOSFET 100 is turned off and improves the breakdown voltage of the MOSFET 100.

The RESURF region 42 includes, for example, aluminum (Al) as p-type impurities. The p-type impurity concentration of the RESURF region 42 is lower than the p-type impurity concentration of the body region 32. The p-type impurity concentration of the RESURF region 42 is, for example, equal to or greater than $1\times10^{16}$ cm$^{-3}$ and equal to or less than $5\times10^{17}$ cm$^{-3}$. The depth of the RESURF region 42 is, for example, equal to or greater than 0.3 μm and equal to or less than 0.6 μm.

The p⁻-type end region 44 is provided in the n⁻-type second drift region 26. The end region 44 is provided so as to come into contact with the low-concentration pillar region 28.

The second drift region 26 is interposed between a corner portion 46 of the end region 44, which is close to the rear surface of the SiC layer 10, and the RESURF region 42. The end (bottom) of the end region 44, which is close to the rear surface of the SiC layer 10, forms an acute angle with the boundary between the end region 44 and the n⁻-type second drift region 26. In other words, the width of the end region 44 gradually increases in a direction from the front surface to the rear surface of the SiC layer 10. That is, the corner portion 46 formed by the bottom and the side of the end region 44 has an acute angle. The acute angle is, for example, equal to or less than 80 degrees.

The end (bottom) of the end region 44, which is close to the rear surface of the SiC layer 10, forms an acute angle with the boundary between the end region 44 and the low-concentration pillar region 28.

The end region 44 includes, for example, aluminum (Al) as p-type impurities. The p-type impurity concentration of the end region 44 is lower than the p-type impurity concentration of the low-concentration pillar region 28. The p-type impurity concentration of the end region 44 is, for example, equal to or greater than $5\times10^{15}$ cm$^{-3}$ and equal to or less than $5\times10^{17}$ cm$^{-3}$.

The impurity concentration of each region in the SiC layer 10 can be measured by, for example, secondary ion mass spectrometry (SIMS). In addition, the width, shape, and depth of each region in the SiC layer 10 can be measured by, for example, scanning capacitance microscopy (SCM). The magnitude relationship between the impurity concentrations of each region in the SiC layer 10 can be determined by, for example, SCM.

Next, a method for manufacturing the MOSFET 100 according to this embodiment will be described. A method for manufacturing the end region 44, the low-concentration pillar region 28, the high-concentration pillar region 30, and the source region 34 will be mainly described.

Figure 3:
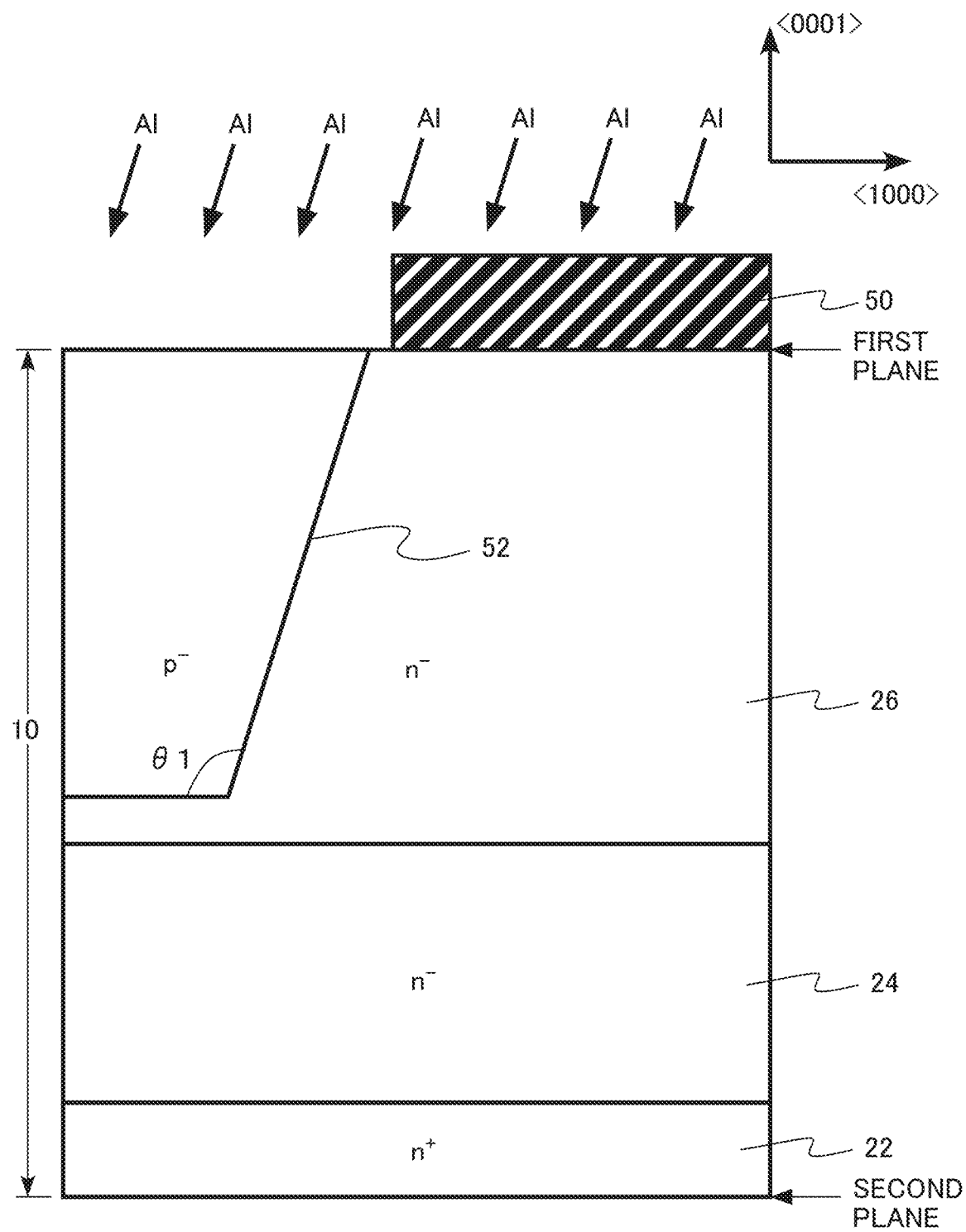
FIG. 3 is a cross-sectional view schematically illustrating the semiconductor device which is being manufactured in a semiconductor device manufacturing method according to the first embodiment.
Figure 4:
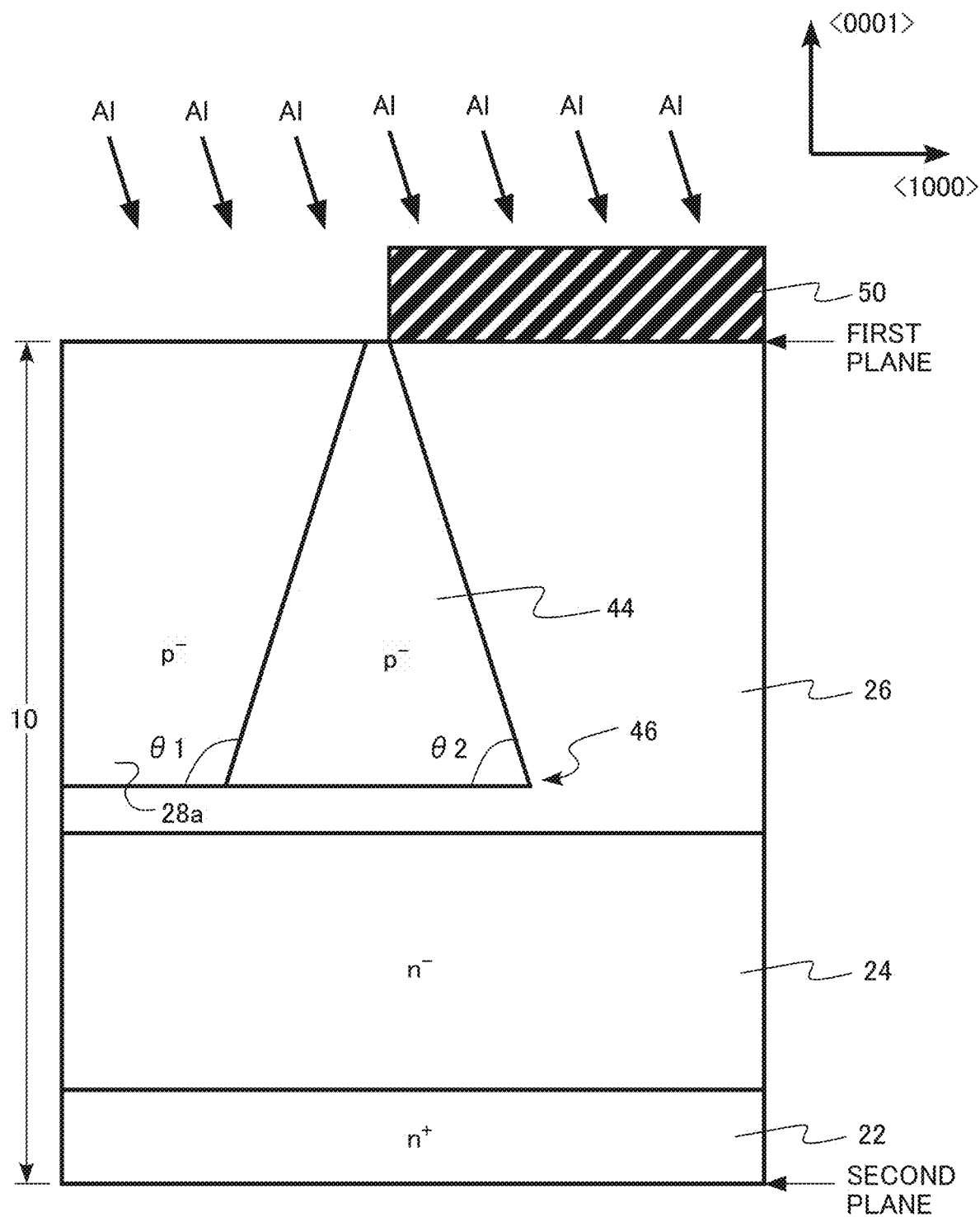
FIG. 4 is a cross-sectional view schematically illustrating the semiconductor device which is being manufactured in the semiconductor device manufacturing method according to the first embodiment.
Figure 5:
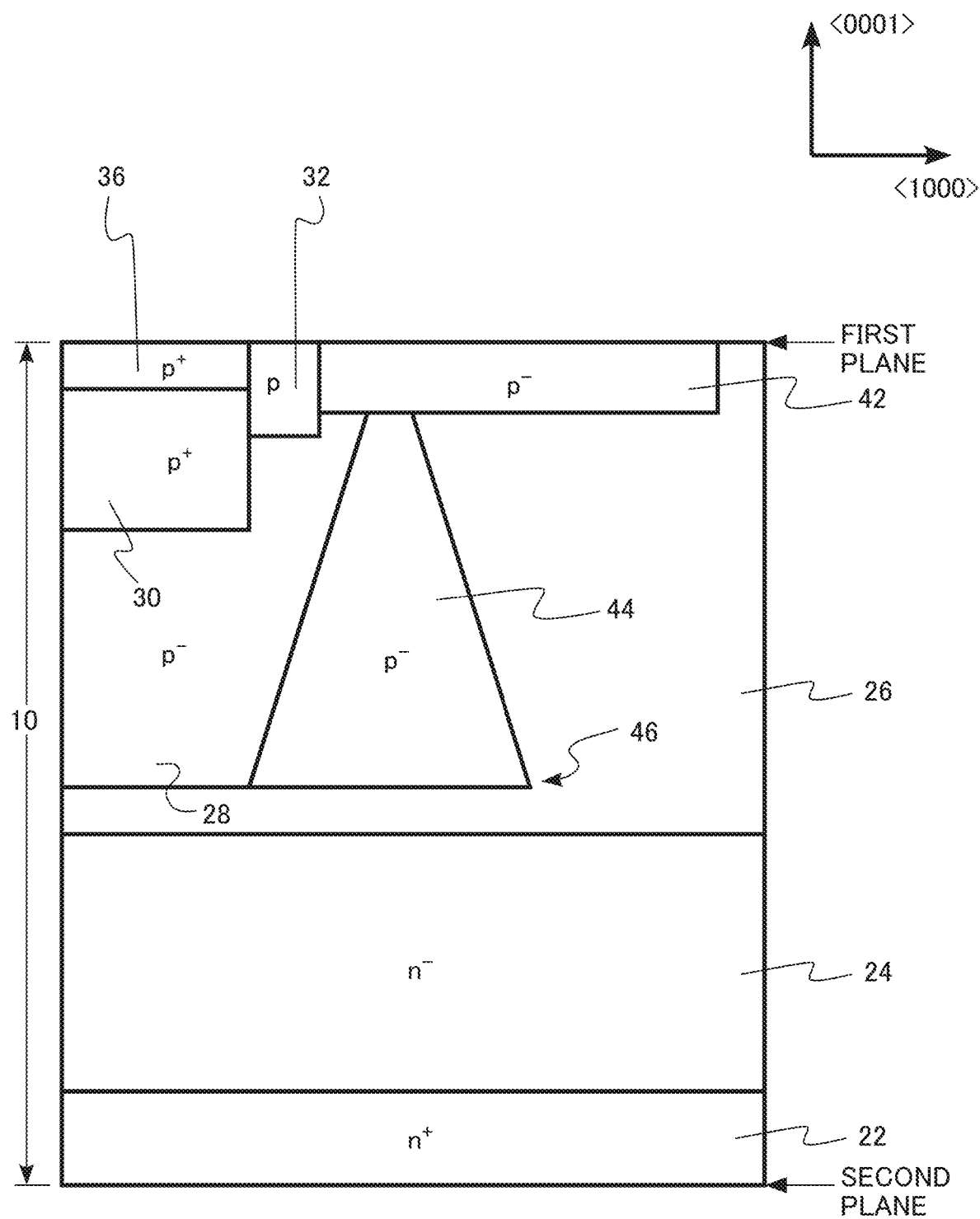
FIG. 5 is a cross-sectional view schematically illustrating the semiconductor device which is being manufactured in the semiconductor device manufacturing method according to the first embodiment.

FIGS. 3, 4, and 5 are cross-sectional views schematically illustrating the semiconductor device which is being manufactured in the semiconductor device manufacturing method according to this embodiment.

The n⁻-type first drift region 24 and the n⁻-type second drift region 26 are formed on the n⁺-type drain region 22 by epitaxial growth. In this way, the SiC layer 10 is formed.

Then, a mask member 50 is formed on the surface of the second drift region 26. The mask member 50 is a silicon oxide film which is formed by, for example, a chemical vapor deposition (CVD) method.

Then, a first ion implantation process that implants aluminum (Al) ions, which are p-type impurity ions, into the second drift region 26 using the mask member 50 as a mask is performed (FIG. 3).

The aluminum ions are implanted by oblique ion implantation which implants ions in an oblique direction with respect to the front surface of the SiC layer 10. A p-type region 52 is formed in the second drift region 26 by the implantation of the aluminum ions. The angle formed between the end (bottom) of the p-type region 52, which is close to the rear surface of the SiC layer 10, and the boundary between the p-type region 52 and the n$^-$-type second drift region 26 is an obtuse angle which is an inclination angle θ1 corresponding to the inclination angle with respect to the first plane in the first ion implantation process.

Then, a second ion implantation process that implants aluminum (Al) ions, which are p-type impurity ions, into the second drift region 26 using the mask member 50 as a mask is performed (FIG. 4). At that time, oblique ion implantation is performed in a direction opposite to the oblique direction in the first ion implantation process. The aluminum ion may be a univalent ion, a bivalent ion, or a trivalent ion.

An overlap region between the p-type region 52 and the aluminum-implanted region is the low-concentration pillar region 28. A non-overlap region between the p-type region 52 and the aluminum-implanted region is the end region 44. The angle formed between the end (bottom) of the end region 44, which is close to the rear surface of the SiC layer 10, and the boundary between the end region 44 and the n$^-$-type second drift region 26 is an acute angle which is an inclination angle θ2 corresponding to the inclination angle with respect to the first plane in the second ion implantation process. The inclination angle θ2 is, for example, equal to or less than 80 degrees.

The aluminum impurity concentration of the end region 44 is half the aluminum impurity concentration of the low-concentration pillar region 28. In other words, the aluminum impurity concentration of the low-concentration pillar region 28 is twice as high as the aluminum impurity concentration of the end region 44.

In the first and second ion implantation processes, ions are implanted into the SiC layer 10 in the direction of <10-1-1>±1 degrees or <10-1-2>±1 degrees. Here, the <10-1-1> direction indicates a direction equivalent to the [10-1-1] direction in the crystal structure. In addition, the <10-1-2> direction indicates a direction equivalent to the [10-1-2] direction in the crystal structure.

The <10-1-1> direction is a direction that is inclined at an angle of about 17 degrees with respect to the c-axis in the plane including the a-axis and the c-axis. In addition, the <10-1-2> direction is a direction that is inclined at an angle of about 8.7 degrees with respect to the c-axis in the plane including the a-axis and the c-axis.

In this embodiment, for example, the cross section illustrated in FIG. 4 is perpendicular to the a-axis and the c-axis. In this embodiment, the low-concentration pillar region 28 and the gate electrode 18 extend in the a-axis direction.

Then, the mask member 50 is removed and aluminum (Al) ions are implanted, using another mask member as a mask, to form the p$^+$-type high-concentration pillar region 30.

The aluminum ions are implanted by oblique ion implantation which implants ions into the front surface of the SiC layer 10 in an oblique direction. The aluminum ion may be a univalent ion, a bivalent ion, or a trivalent ion.

In the ion implantation, ions are implanted into the SiC layer 10 in the direction of <000-1>±1 degrees. The <000-1> direction is parallel to the c-axis.

Then, the mask member is removed and aluminum (Al) ions are implanted, using another mask member as a mask, to form the p-type body region 32.

Then, the mask member is removed and nitrogen (N) ions are implanted, using another mask member as a mask, to form the n$^+$-type source region 34.

The nitrogen ions are implanted by oblique ion implantation which implants ions into the front surface of the SiC layer 10 in an oblique direction.

In the ion implantation, ions are implanted into the SiC layer 10 in the direction of <10-1-1>±1 degrees or <10-1-2>±1 degrees. The <10-1-1> direction is a direction that is inclined at an angle of about 17 degrees with respect to the c-axis in the plane including the a-axis and the c-axis. In addition, the <10-1-2> direction is a direction that is inclined at an angle of about 8.7 degrees with respect to the c-axis in the plane including the a-axis and the c-axis.

Then, the mask member is removed and aluminum (Al) ions are implanted, using another mask member as a mask, to form the p$^+$-type contract region 36.

Then, the mask member is removed and aluminum (Al) ions are implanted, using another mask member as a mask, to form the p$^-$-type RESURF region 42.

Then, the trench 40, the gate insulating film 16, the gate electrode 18, the interlayer insulating film 20, the source electrode 12, and the drain electrode 14 are formed by a known process. In this way, the MOSFET 100 is manufactured.

Next, the function and effect of the semiconductor device manufacturing method and the semiconductor device according to this embodiment will be described.

Figure 6:
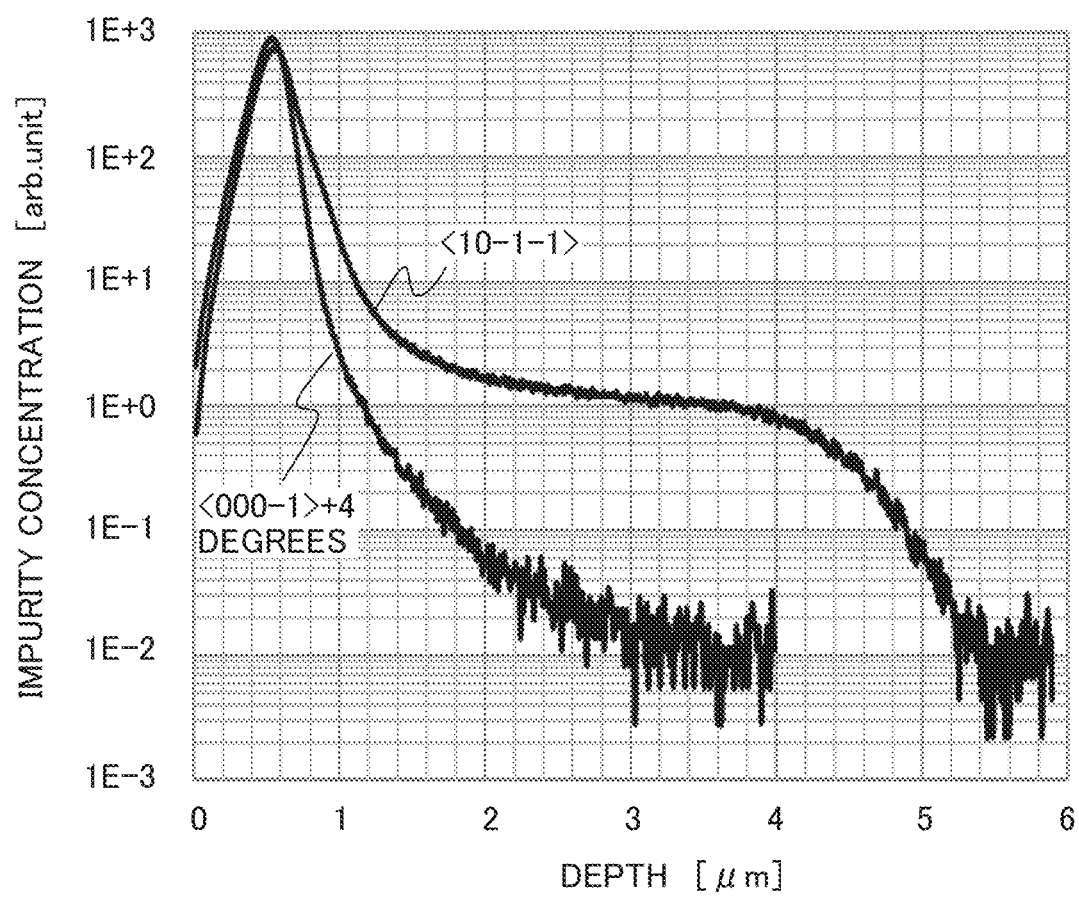
FIG. 6 is a diagram illustrating the function and effect of the first embodiment.

FIG. 6 is a diagram illustrating the function and effect of this embodiment. FIG. 6 illustrates an impurity profile in the depth direction in a case in which aluminum ions are implanted into the SiC layer. The front surface of the SiC layer has an off angle of 4 degrees with respect to the c-face, that is, the (0001) face. The SiC layer is a 4H—SiC layer.

Aluminum ions were implanted with an accelerating voltage of 500 keV. The implantation depth when ions were implanted in the direction of <000-1>+4 degrees, that is, in a direction that was inclined at an angle of 4 degrees with respect to the c-axis was compared with the implantation depth when ions were implanted in the <10-1-1> direction, that is, a direction that was inclined at an angle of about 17 degrees with respect to the c-axis in the plane including the a-axis and the c-axis.

As can be seen from FIG. 6, when ions were implanted in the <10-1-1> direction, the implantation depth of aluminum was about two to third times greater than that when ions were implanted in the direction of <000-1>+4 degrees at the same accelerating voltage level.

Figure 7:
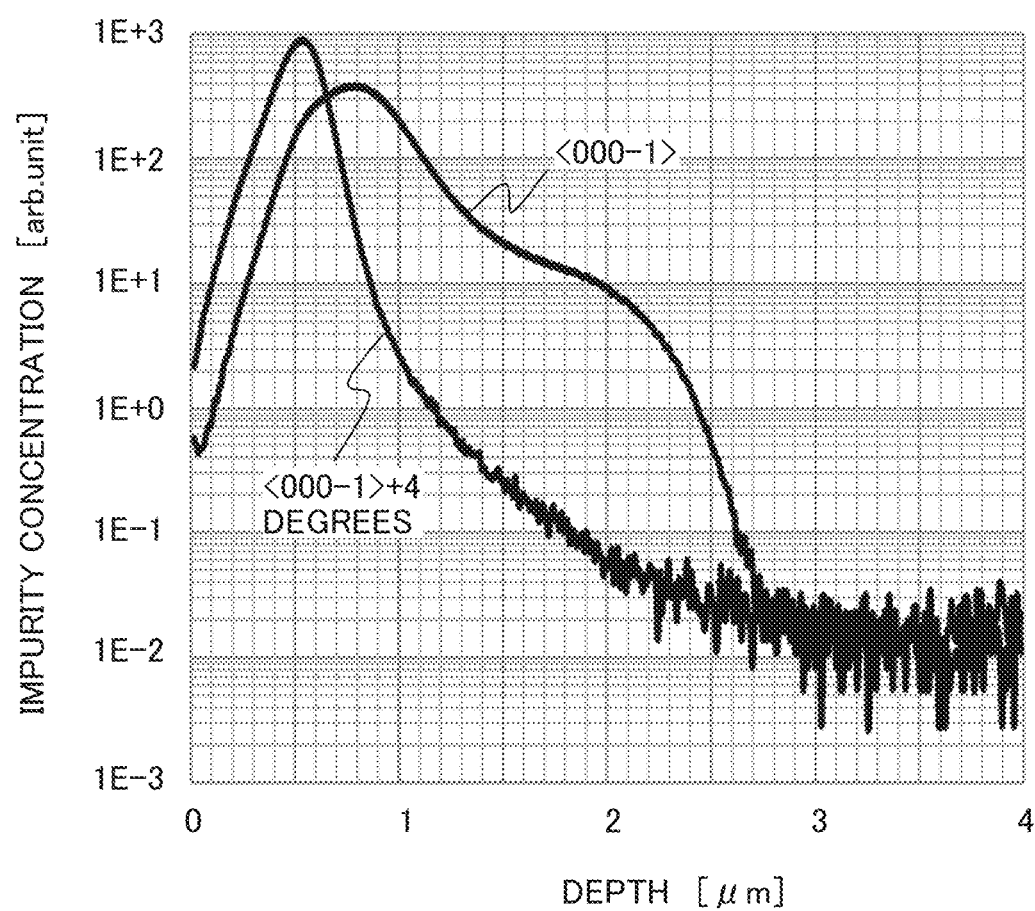
FIG. 7 is a diagram illustrating the function and effect of the first embodiment.

FIG. 7 is a diagram illustrating the function and effect of this embodiment. FIG. 7 illustrates an impurity profile in the depth direction in a case in which aluminum ions are implanted into the SiC layer. The front surface of the SiC layer has an off angle of 4 degrees with respect to the c-face, that is, the (0001) face. The SiC layer is a 4H—SiC layer.

Aluminum ions were implanted with an accelerating voltage of 350 keV. The implantation depth when ions were implanted in the direction of <000-1>+4 degrees, that is, in a direction that was inclined at an angle of 4 degrees with respect to the c-axis was compared with the implantation depth when ions were implanted in the <000-1> direction, that is, a direction that was parallel to the c-axis. The SiC layer is a 4H—SiC layer.

As can be seen from FIG. 7, when ions were implanted in the <000-1> direction, the implantation depth of aluminum was equal to or greater than that when ions were implanted in the direction of <000-1>+4 degrees at the same accelerating voltage level.

Figure 8:
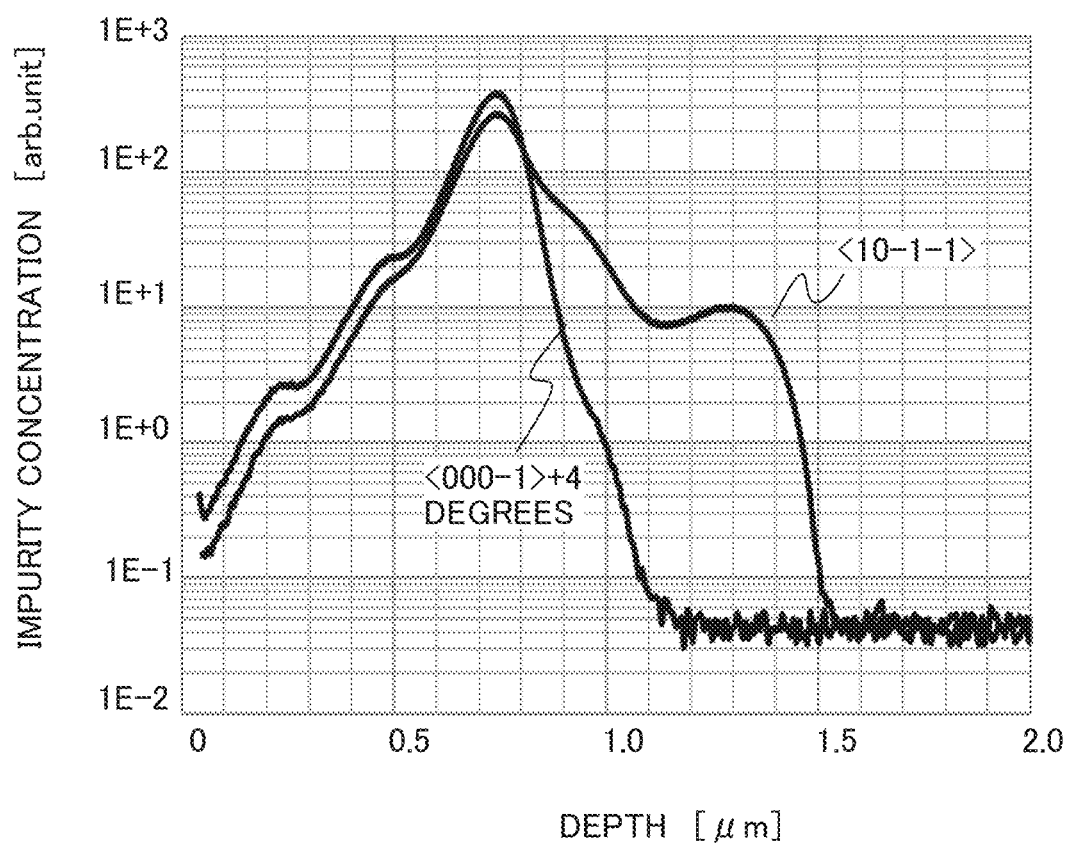
FIG. 8 is a diagram illustrating the function and effect of the first embodiment.

FIG. 8 is a diagram illustrating the function and effect of this embodiment. FIG. 8 illustrates an impurity profile in the depth direction in a case in which nitrogen ions are implanted into the SiC layer. The front surface of the SiC layer has an off angle of 4 degrees with respect to the c-face, that is, the (0001) face. The SiC layer is a 4H—SiC layer.

Nitrogen ions were implanted with an accelerating voltage of 680 keV. The implantation depth when ions were implanted in the direction of <000-1>+4 degrees, that is, in a direction that was inclined at an angle of 4 degrees with respect to the c-axis was compared with the implantation depth when ions were implanted in the <10-1-1> direction, that is, a direction that was inclined at an angle of about 17 degrees with respect to the c-axis in the plane including the a-axis and the c-axis.

As can be seen from FIG. 8, when ions were implanted in the <10-1-1> direction, the implantation depth of nitrogen was about 1.5 times greater than that when ions were implanted in the direction of <000-1>+4 degrees at the same accelerating voltage level.

Figure 9:
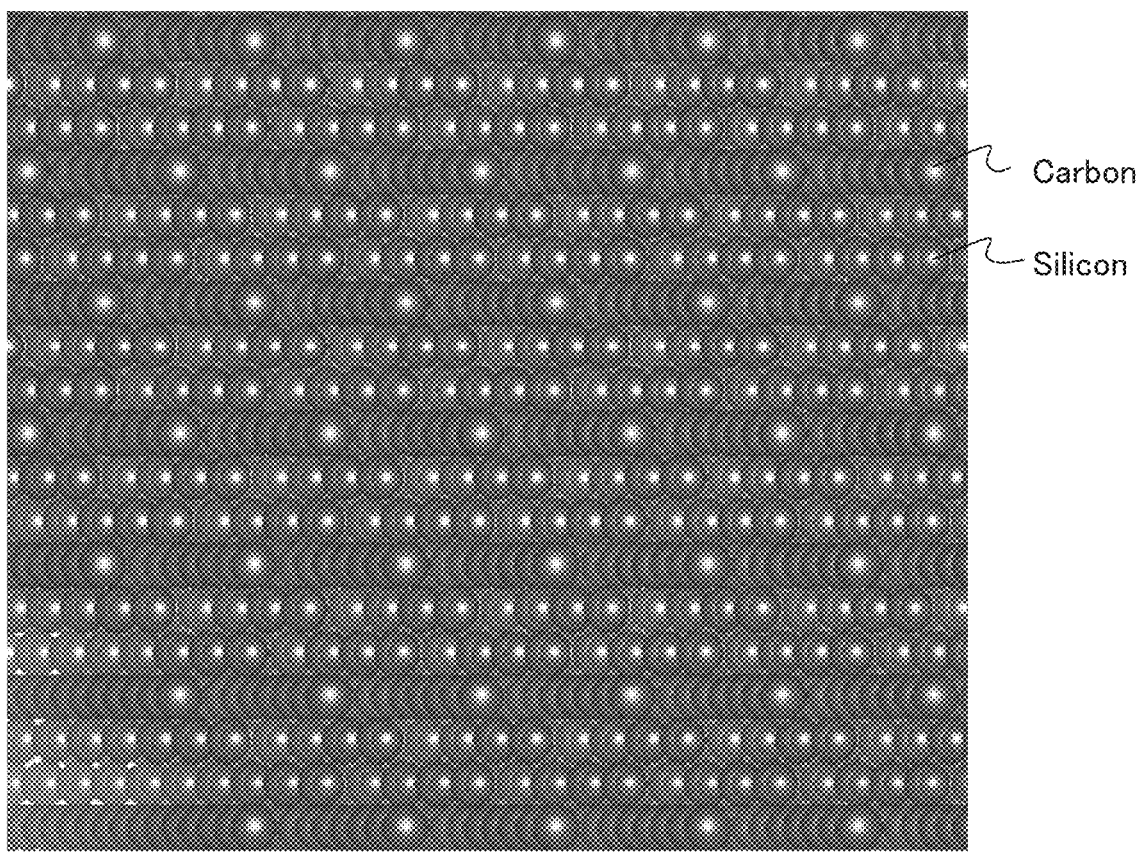
FIG. 9 is a diagram illustrating the function and effect of the first embodiment.
Figure 10:
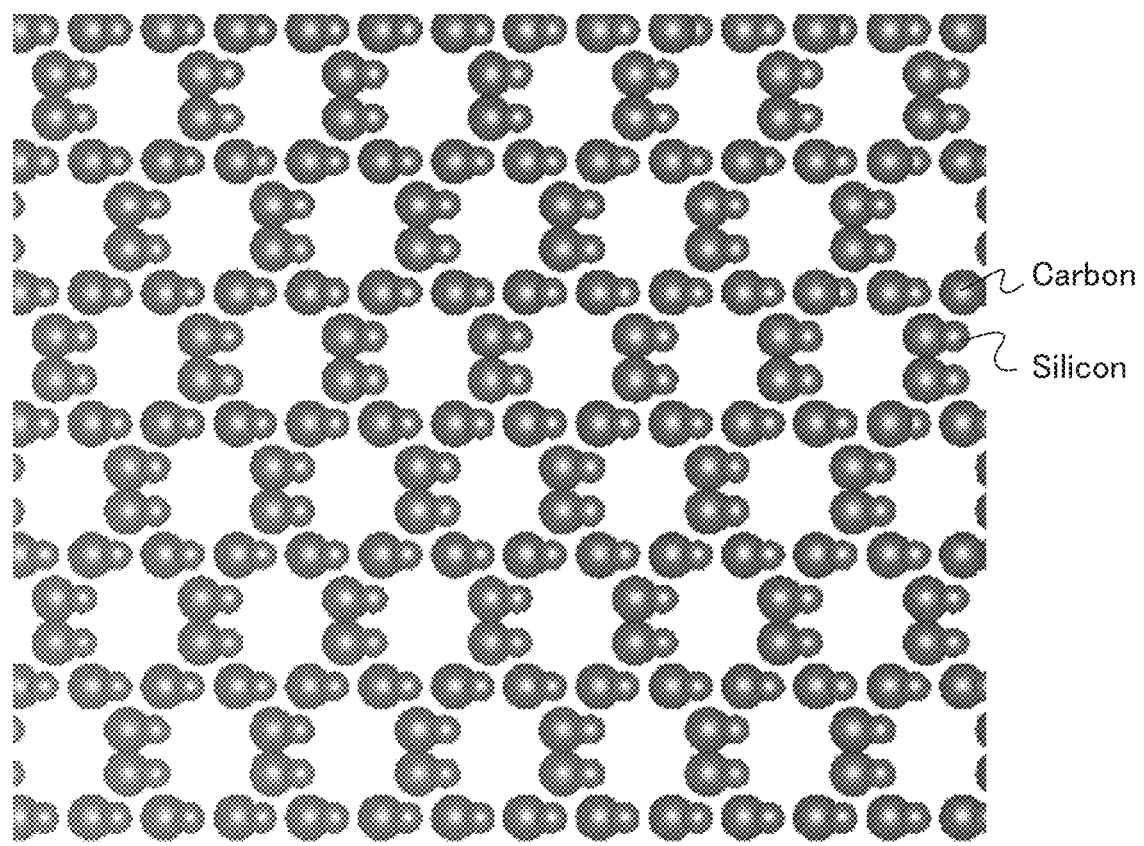
FIG. 10 is a diagram illustrating the function and effect of the first embodiment.
Figure 11:
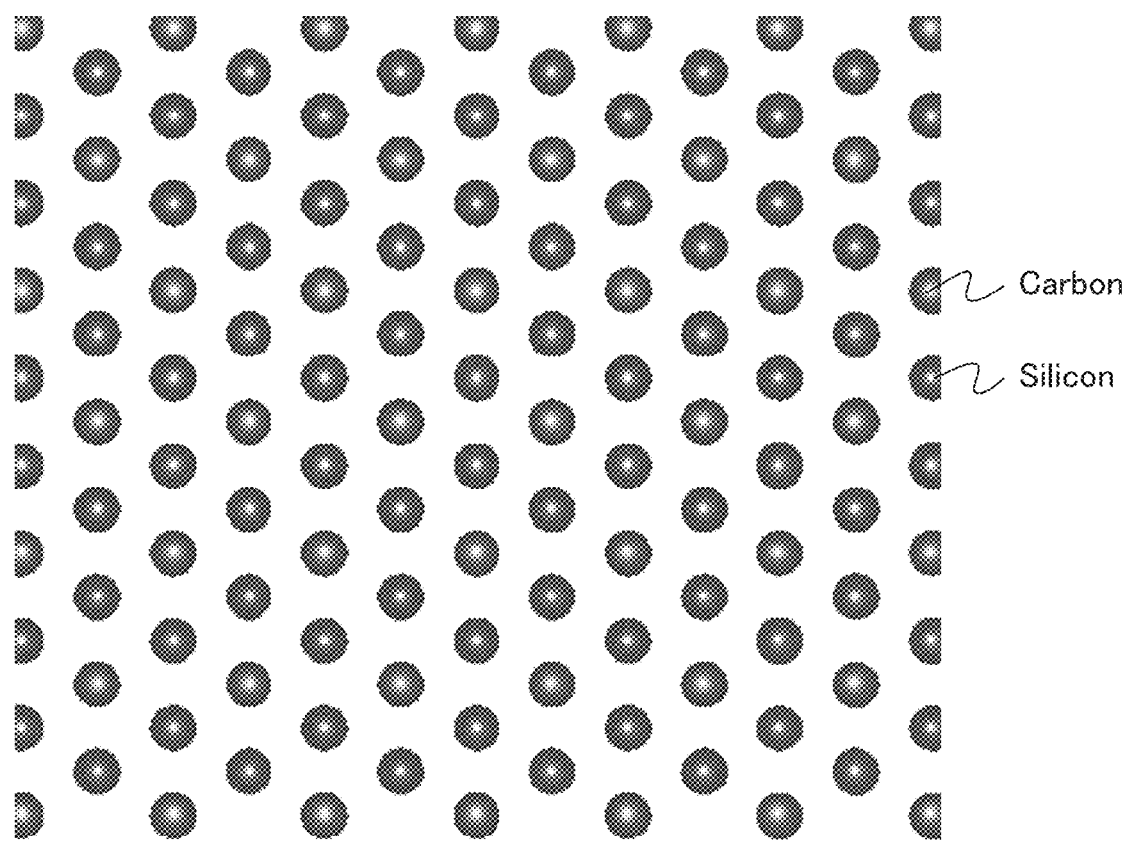
FIG. 11 is a diagram illustrating the function and effect of the first embodiment.

FIGS. 9, 10, and 11 are diagrams illustrating the function and effect of this embodiment. FIGS. 9, 10, and 11 are diagrams illustrating the arrangement of silicon (Si) atoms and carbon (C) atoms when the crystal structure of SiC is viewed from a specific direction. In FIGS. 9, 10, and 11, VESTA3 (K. Momma and F. Izumi, "VESTA 3 for three-dimensional visualization of crystal, volumetric and morphology data," J. Appl. Crystallogr., 44, 1272-1276 (2011)), which was three-dimensional drawing software, was used.

FIG. 9 illustrates the arrangement of silicon atoms and carbon atoms when the crystal structure of 4H—SiC is viewed from the direction of <000-1>+4 degrees, that is, a direction that is inclined at an angle of 4 degrees with respect to the c-axis. The silicon atoms and the carbon atoms are densely arranged so as to overlap each other, without any gap therebetween.

FIG. 10 illustrates the arrangement of silicon atoms and carbon atoms when the crystal structure of 4H—SiC is viewed from the <10-1-1> direction, that is, a direction that is inclined at an angle of about 17 degrees with respect to the c-axis in the plane including the a-axis and the c-axis. There is a region in which the gap between the silicon atom and the carbon atom is large.

FIG. 11 illustrates the arrangement of silicon atoms and carbon atoms when the crystal structure of 4H—SiC is viewed from the <000-1> direction, that is, a direction that is parallel to the c-axis. There is a region in which the gap between the silicon atom and the carbon atom is large.

As described above, when impurity ions are implanted into the SiC layer in the <10-1-1> direction and the <000-1> direction, the impurity ions are deeply implanted in the SiC layer. It is considered that this is because channeling in which impurity ions pass through the gap between the silicon atom and the carbon atom occurs. Therefore, it is possible to form a deep pn junction in the SiC layer.

When the ion implantation direction is in the range of <10-1-1>±1 degrees, a channeling effect is obtained. It is preferable that the ion implantation direction be in the range of <10-1-1>±0.5 degrees in order to sufficiently obtain the channeling effect.

The arrangement of the silicon atoms and the carbon atoms as viewed in the <10-11> direction is the same as the arrangement of the silicon atoms and the carbon atoms as viewed from the <10-1-1> direction in appearance. Therefore, in the case of the <10-11> direction, the same effect as that in the case of the <10-1-1> direction is obtained.

When the ion implantation direction is in the range of <000-1>±1 degrees, the channeling effect is obtained. It is preferable that the ion implantation direction be in the range of <000-1>±0.5 degrees in order to sufficiently obtain the channeling effect.

The arrangement of the silicon atoms and the carbon atoms as viewed in the <0001> direction is the same as the arrangement of the silicon atoms and the carbon atoms as viewed from the <000-1> direction in appearance. Therefore, in the case of the <0001> direction, the same effect as that in the case of the <000-1> direction is obtained.

When the crystal structure of 4H—SiC is viewed from the <10-12> direction and the <10-1-2> direction, that is, a direction that is inclined at an angle of about 8.7 degrees with respect to the c-axis in the plane including the a-axis and the c-axis, there is a region in which the gap between the silicon atom and the carbon atom is large. Therefore, when impurity ions are implanted in the direction of <10-12>±1 degrees or <10-1-2>±1 degrees, channeling also occurs. It is preferable that the ion implantation direction be in the range of <10-12>±0.5 degrees or <10-1-2>±0.5 degrees in order to sufficiently obtain the channeling effect.

In the case of 6H—SiC having a longer c-axis than 4H—SiC, when ions are implanted in the direction of <10-11>±1 degrees, <10-1-1>±1 degrees, <10-12>±1 degrees, <10-1-2>±1 degrees, <0001>±1 degrees, or <000-1>±1 degrees, channeling occurs similarly to 4H—SiC. Therefore, the same effect as that in the case of 4H—SiC is obtained.

In the case of 6H—SiC, the <10-11> direction and the <10-1-1> direction are inclined at an angle of about 11.5 degrees with respect to the c-axis in the plane including the a-axis and the c-axis. In addition, the <10-12> direction and the <10-1-2> direction are inclined at an angle of about 5.8 degrees with respect to the c-axis in the plane including the a-axis and the c-axis.

In the manufacturing method according to this embodiment, when the p⁻-type low-concentration pillar region 28 and the end region 44 are formed, aluminum ions are implanted into the SiC layer 10 in the direction of <10-1-1>±1 degrees or <10-1-2>±1 degrees. Therefore, it is possible to form a deep pn junction with low accelerating voltage.

In the manufacturing method according to this embodiment, when the p⁻-type high-concentration pillar region 30 is formed, aluminum ions are implanted into the SiC layer 10 in the direction of <000-1>±1 degrees. Therefore, it is possible to form a deep pn junction with low accelerating voltage.

In the manufacturing method according to this embodiment, when the n⁺-type source region 34 is formed, nitrogen ions are implanted into the SiC layer 10 in the direction of <10-1-1>±1 degrees or <10-1-2>±1 degrees. Therefore, it is possible to form a pn junction with low accelerating voltage.

In the trench-gate MOSFET 100 according to this embodiment, it is possible to perform scaling-down, as compared to a planar MOSFET, and thus to improve channel density. Therefore, the on-resistance of the MOSFET is reduced. However, there is a problem that the breakdown of the gate insulating film occurs due to the concentration of the electric field on the bottom of the trench.

In the MOSFET 100 according to this embodiment, the p$^+$-type high-concentration pillar region 30 which is deeper than the trench 40 is formed on both sides of the trench 40. The concentration of the electric field on the gate insulating film 16 provided at the bottom of the trench 40 is reduced by a depletion layer which is spread from the p$^+$-type high-concentration pillar region 30 to the n$^-$-type second drift region 26. Therefore, the breakdown of the gate insulating film due to the concentration of the electric field on the bottom of the trench is suppressed.

The MOSFET 100 according to this embodiment has the SJ structure. Therefore, a reduction in the breakdown voltage is suppressed.

Therefore, according to the MOSFET 100, it is possible to suppress the breakdown of the gate insulating film 16, an increase in the on-resistance, and a reduction in the breakdown voltage.

In this embodiment, as illustrated in FIG. 2, the end region 44 having the bottom which protrudes toward the second drift region 24 is provided in the termination region. The concentration of the electric field in the termination region is reduced by the end region 44. The concentration of the electric field in the termination region is also reduced by the p$^-$-type low-concentration pillar region 28 and the end region 44 of which the impurity concentration is half the impurity concentration of the p$^-$-type low-concentration pillar region 28. Therefore, the breakdown voltage of the MOSFET 100 is improved.

For example, when the end region 44 is formed by only one oblique ion implantation process, the end region 44 has a parallelogram shape. In other words, one corner of the bottom of the end region 44 has an acute angle and the other corner of the bottom has an obtuse angle. In this case, the breakdown voltage is unbalanced, which is not preferable. In this embodiment, both corners of the bottom of the end region 44 have an acute angle. Therefore, the breakdown voltage is not unbalanced and it is possible to achieve the MOSFET 100 with an improved breakdown voltage.

It is more preferable that the corner portion 46 of the end region 44 have an acute angle of 80 degrees or less in order to reduce the concentration of the electric field.

As described above, according to the method for manufacturing the MOSFET 100 of this embodiment, since an appropriate ion implantation direction is selected, it is easy to form a pn junction including a deep pn junction. In addition, according to the MOSFET 100 of this embodiment, since the end region 44 is provided in the termination region, the breakdown voltage is improved.

Second Embodiment

A method for manufacturing a semiconductor device according to a second embodiment differs from the manufacturing method according to the first embodiment in that oblique ion implantation is used to form the body region of the MOSFET and the MOSFET is not a trench gate type, but is a planar gate type. Hereinafter, the description of the same content as that in the first embodiment will not be repeated.

Figure 12:
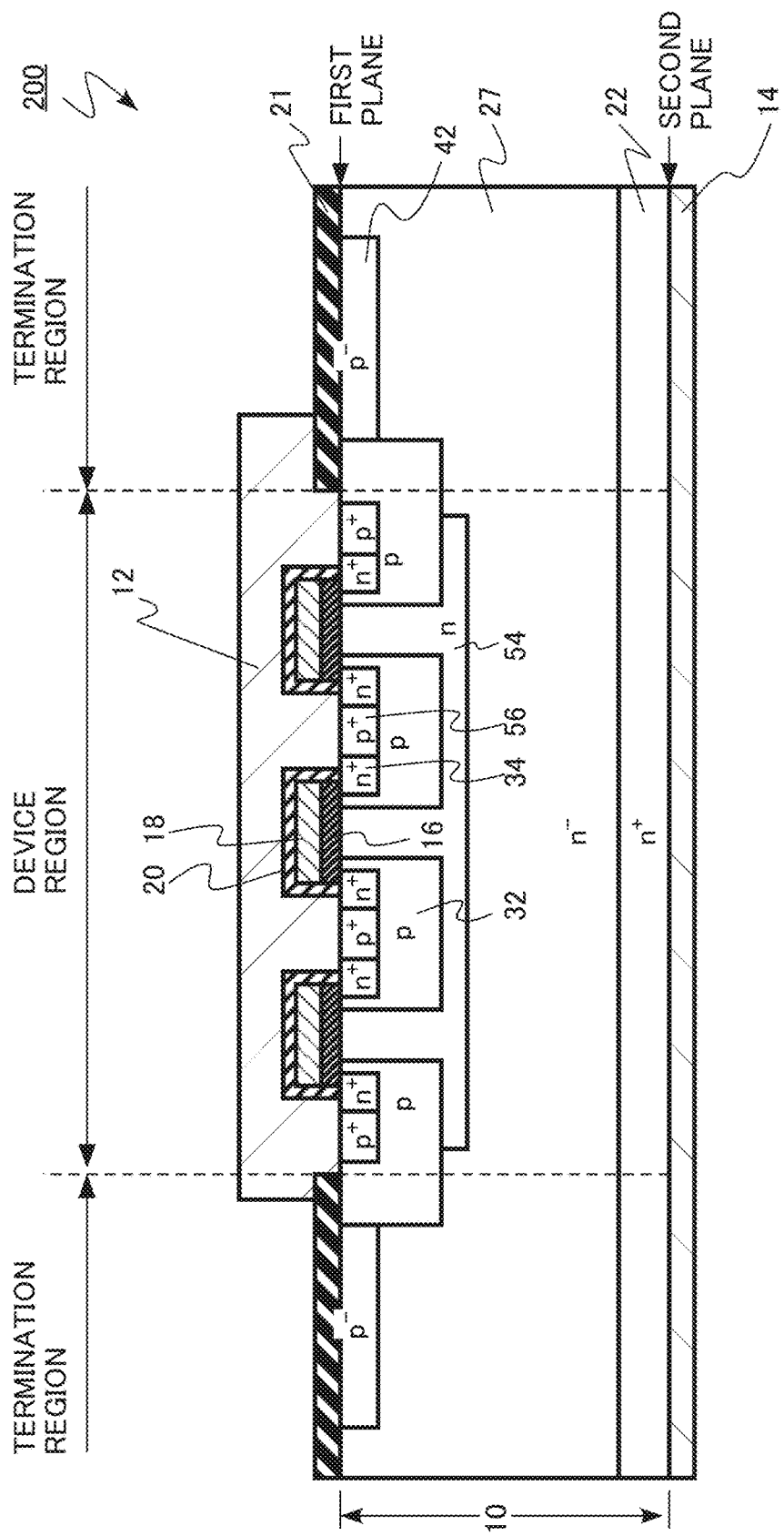
FIG. 12 is a cross-sectional view schematically illustrating a semiconductor device according to a second embodiment.
Figure 13:
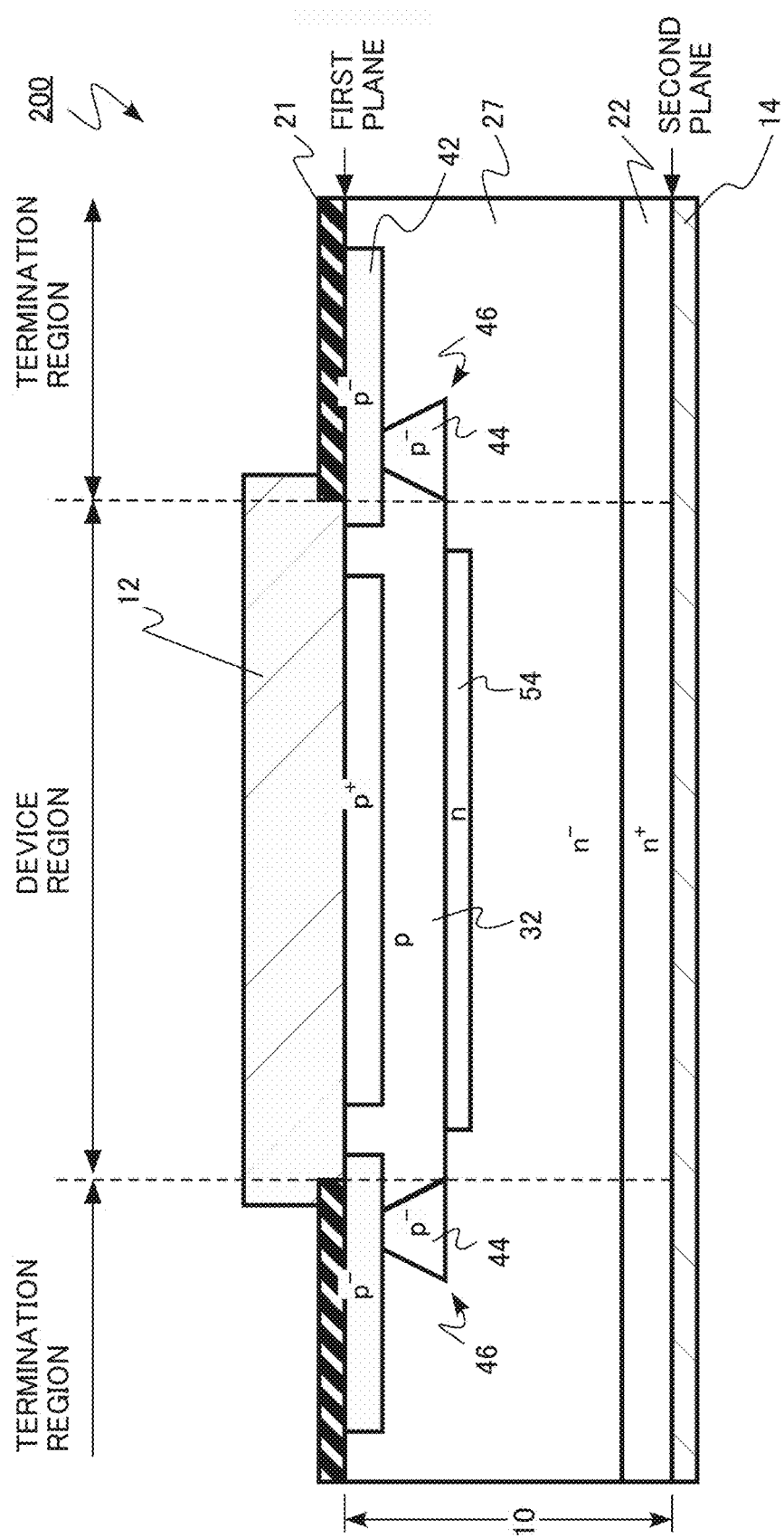
FIG. 13 is a cross-sectional view schematically illustrating the semiconductor device according to the second embodiment.

FIGS. 12 and 13 are cross-sectional views schematically illustrating the semiconductor device according to this embodiment. FIG. 12 is a cross-sectional view perpendicular to a direction in which a gate electrode extends. FIG. 13 is a cross-sectional view which is parallel to the direction in which the gate electrode extends and includes the body region. The semiconductor device according to this embodiment is a vertical planar-gate MOSFET 200 using silicon carbide (SiC). Hereinafter, an example in which a first conductivity type is an n type and a second conductivity type is a p type will be described.

The MOSFET 200 includes a SiC layer 10, a source electrode (first electrode) 12, a drain electrode (second electrode) 14, a gate insulating film 16, a gate electrode 18, an interlayer insulating film 20, and a field insulating film 21. The SiC layer 10 includes an n$^+$-type drain region 22, a drift region (first SiC region) 27, a p-type body region 32, an n$^+$-type source region 34, a p$^-$-type RESURF region (second SiC region) 42, an end region (third SiC region) 44, an n-type region 54, and a p$^+$-type contract region 56.

An device region of the MOSFET 200 includes the n-type region 54. The n-type region 54 is provided between the n$^-$-type drift region 27 and the front surface of the SiC layer 10. The n-type region 54 is provided between the p-type body regions 32. The n-type region 54 has a function of reducing on-resistance.

The n-type region 54 includes, for example, nitrogen (N) as n-type impurities.

A termination region of the MOSFET 200 includes the p$^-$-type RESURF region 42 and the p$^-$-type end region 44. The p$^-$-type RESURF region 42 and the p$^-$-type end region 44 form a termination structure of the MOSFET 200.

The p$^-$-type RESURF region 42 is provided in the n$^-$-type drift region 27. The p$^-$-type RESURF region 42 is provided between the n$^-$-type drift region 27 and the front surface of the SiC layer 10. The RESURF region 42 is provided so as to come into contact with the front surface of the SiC layer 10. The RESURF region 42 comes into contact with the body region 32. The field insulating film 21 is provided on the RESURF region 42.

The RESURF region 42 is provided in an annular shape which surrounds the device region of the MOSFET 200. The RESURF region 42 is provided so as to come into contact with the p-type body region 32. The RESURF region 42 has a function which reduces the high electric field applied to a termination portion of the device region when the MOSFET 200 is turned off and improves the breakdown voltage of the MOSFET 200.

The RESURF region 42 includes, for example, aluminum (Al) as p-type impurities. The p-type impurity concentration of the RESURF region 42 is lower than, for example, the p-type impurity concentration of the body region 32. The p-type impurity concentration of the RESURF region 42 is, for example, equal to or greater than $1\times10^{16}$ cm$^{-3}$ and equal to or less than $5\times10^{17}$ cm$^{-3}$. The depth of the RESURF region 42 is, for example, equal to or greater than 0.3 μm and equal to or less than 0.6 μm.

The p$^-$-type end region 44 is provided in the n$^-$-type drift region 27.

The drift region 27 is interposed between a corner portion 46 of the end region 44, which is close to the rear surface of the SiC layer 10, and the RESURF region 42. The end (bottom) of the end region 44, which is close to the rear surface of the SiC layer 10, forms an acute angle with the boundary between the end region 44 and the n$^-$-type drift region 27. In other words, the width of the end region 44 gradually increases from the front surface to the rear surface of the SiC layer 10. That is, the corner portion 46 formed by the bottom and the side of the end region 44 has an acute angle. The acute angle is, for example, equal to or less than 80 degrees.

In addition, the end (bottom) of the end region 44, which is close to the rear surface of the SiC layer 10, forms an acute angle with the boundary between the end region 44 and the body region 32.

The end region 44 includes, for example, aluminum (Al) as p-type impurities. The p-type impurity concentration of the end region 44 is lower than the p-type impurity concentration of the body region 32. The p-type impurity concentration of the end region 44 is, for example, equal to or greater than $5 \times 10^{16}$ cm$^{-3}$ and equal to or less than $2.5 \times 10^{18}$ cm$^{-3}$.

The body region 32 and the end region 44 are formed by the implantation of aluminum ions. Two oblique ion implantation processes are performed to implant ions into the front surface of the SiC layer 10 in an oblique direction. A first ion implantation process and a second ion implantation process are oblique ion implantation processes which obliquely implant ions in the opposite direction.

An overlap region between the first ion implantation process and the second ion implantation process is the body region 32. A non-overlap region between the first ion implantation process and the second ion implantation process is the end region 44.

The aluminum impurity concentration of the end region 44 is half the aluminum impurity concentration of the body region 32. In other words, the aluminum impurity concentration of the body region 32 is twice as high as the aluminum impurity concentration of the end region 44.

For example, the first and second ion implantation processes implant ions into the SiC layer 10 in the direction of <10-1-1>±1 degrees or <10-1-2>±1 degrees.

The n-type region 54 is formed by the implantation of nitrogen (N) ions. For example, nitrogen ions are implanted into the SiC layer 10 in the direction of <10-1-1>±1 degrees or <10-1-2>±1 degrees to form the n-type region 54.

According to the method for manufacturing the MOSFET 200 of this embodiment, since an appropriate ion implantation direction is selected, it is easy to form a pn junction including a deep pn junction, similarly to the first embodiment. In addition, according to the MOSFET 200 of this embodiment, similarly to the first embodiment, since the end region 44 is provided in the termination region, the breakdown voltage is improved.

In the first and second embodiments, an example of the front surface of the SiC layer 10 is a plane which has an off angle with respect to the (0001) face. However, other planes may be applied as the front surface of the SiC layer 10.

In the first and second embodiments, the first conductivity type is an n type and the second conductivity type is a p type. However, the first conductivity type may be a p type and the second conductivity type may be an n type.

In the first and second embodiments, aluminum (Al) is given as an example of the p-type impurities. However, boron (B) may be used as the p-type impurities. In addition, nitrogen (N) is given as an example of the n-type impurities. However, for example, phosphor (P), arsenic (As), and antimony (Sb) may be used as the n-type impurities. The valence of impurity ions to be implanted can be appropriately selected.

In the first and second embodiments, the MOSFET is given as an example. However, the invention can also be applied to other SiC devices, such as a PiN diode, a Schottky barrier diode (SBD), a junction barrier Schottky diode (JBS), a merged PiN Schottky diode (MPS), and an insulated gate bipolar transistor (IGBT).

While certain embodiments have been described, these embodiments have been presented by way of example only, and are not intended to limit the scope of the inventions. Indeed, the semiconductor device manufacturing method and the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device comprising:
    providing a SiC layer having an inherent coordinate system defined by a crystal orientation of the SiC layer, a front surface of the SiC layer being inclined at an angle within a range having a lower value of 0 degrees and an upper value of 8 degrees with respect to a (0001) face; and
    implanting first impurity ions into the front surface of the SiC layer in a first direction oblique to the front surface, the first direction being within ±1 degrees in a direction of <10-11>, or <10-1-1> with respect to the inherent coordinate system; and
    implanting second impurity ions into the front surface of the SiC layer in a second direction oblique to the front surface, the second direction being a direction opposite to the first direction with respect to a direction of <0001>.

2. The method for manufacturing a semiconductor device according to claim 1, wherein the first impurity ions and the second impurity ions are aluminum (Al) ions.

* * * * *